United States Patent [19]
Chittipeddi et al.

[11] Patent Number: 6,080,625
[45] Date of Patent: Jun. 27, 2000

[54] METHOD FOR MAKING DUAL-POLYSILICON STRUCTURES IN INTEGRATED CIRCUITS

[75] Inventors: Sailesh Chittipeddi, Allentown; Michael James Kelly, Orefield, both of Pa.

[73] Assignee: Lucent Technologies Inc., Murray Hill, N.J.

[21] Appl. No.: 09/140,275

[22] Filed: Aug. 26, 1998

[51] Int. Cl.⁷ .................................................. H01L 21/336
[52] U.S. Cl. ............................................ 438/259; 438/700
[58] Field of Search ................................. 438/243, 245, 438/164, 242, 246, 259, 386, 700; 257/905, 153

[56] References Cited

U.S. PATENT DOCUMENTS

| | | | |
|---|---|---|---|
| 4,988,639 | 1/1991 | Aomura | 438/427 |
| 5,457,329 | 8/1994 | Harada | 257/153 |
| 5,776,817 | 1/1997 | Liang | 438/427 |

*Primary Examiner*—Charles Bowers
*Assistant Examiner*—Craig Thompson
*Attorney, Agent, or Firm*—Anthony Grillo

[57] ABSTRACT

A process for fabricating novel dual-polysilicon structures comprises forming trenches of differing depths in a field oxide that overlies a substrate. Utilizing an ion implantation barrier in the trenches, ion implantation is performed to create self-aligned structures. Importantly, polysilicon is formed in the trenches in a single deposition.

12 Claims, 4 Drawing Sheets

METHOD FOR MAKING DUAL-POLYSILICON STRUCTURES IN INTEGRATED CIRCUITS

CROSS-REFERENCE TO RELATED APPLICATION

This application is related to application Ser. No. 09/140,270, filed Aug. 26, 1998, entitled "A Capacitor In An Integrated Circuit And A Method Of Manufacturing An Integrated Circuit," which was filed on Aug. 26, 1998 and application Ser. No. 09/140,276, filed Aug. 26, 1998, entitled, "A Method For Forming Dual-Polysilicon Structures Using A Built-In Stop Layer," which was filed on Aug. 26, 1998.

TECHNICAL FIELD

This invention relates to integrated circuits and, more specifically, to dual-polysilicon structures in integrated circuits and a method for making them.

BACKGROUND OF THE INVENTION

Device structures with dual layers of polysilicon over oxide layers of differing thickness have many uses in integrated circuits such as Dynamic Random Access Memory (DRAM) cells, Static Random Access Memory (SRAM) cells, etc. The process for manufacturing dual-polysilicon structures currently requires multiple polysilicon depositions, patterning, and etches. Each deposition, patterning, and etch sequence is both time consuming and costly.

Additionally, the multi-layered polysilicon structure produced by such a known process yields an uneven topology upon which further processing steps must typically be performed. Carrying out further steps on such an uneven topology can be difficult.

SUMMARY OF THE INVENTION

The present invention is directed to a new method for fabricating dual-polysilicon structures and integrated circuits. The method uses fewer steps than those used in prior art processes. In accordance with the invention, trenches of differing depths are formed in a first insulating layer prior to depositing a polysilicon layer. A second insulating layer is then formed in the trenches. In one embodiment, in which a planar structure is sought, an implantation barrier is deposited in each trench, and then ion implantation is performed to create self-aligned source and drain regions. Polysilicon, sufficient to fill the trenches, is then deposited and planarized.

In another embodiment of the invention, polysilicon that only partially fills each trench is formed prior to forming the implantation barrier. Either embodiment reduces the number of steps required to achieve the dual-polysilicon structure using a single polysilicon formation step. Additionally, illustrative embodiments of the present invention provide a structure that has a more level topography than that provided by prior art methods.

The invention further embodies a dual-polysilicon structure with a planar or relatively planar surface. This structure comprises a first insulating layer of substantially uniform depth, trenches of differing depths in the insulating layer, a second insulating layer, thinner than the first insulating layer, at the base of each of the trenches, and polysilicon filling or partially filling the trenches, to form a planar or relatively planar surface.

BRIEF DESCRIPTION OF THE DRAWING

The invention will be more fully understood from the following detailed description taken in connection with the accompanying drawing, in which.

DETAILED DESCRIPTION OF THE INVENTION

In accordance with the principles of the present invention, a new method for fabricating dual-polysilicon structures is characterized by a reduction in the number of steps required to build this type of structure. The process includes fabricating at least two trenches of differing depths and then performing a single polysilicon deposition and etch. Advantageously, these methods may also result in a structure with a planar or flattened topology. The individual steps of the new method utilize standard processing techniques.

The first illustrative embodiment is described below with reference to FIGS. 1 to 4. Formed on the substrate 12 is an insulating layer 10. Insulating layer 10 may be $SiO_2$ and may have a substantially uniform depth. The substrate may be silicon, gallium arsenide, germanium, or other material suitable for use as a substrate as is known to those skilled in this art. There may be one or more layers formed between the substrate 12 and the insulating layer 10. The thickness of the insulating layer 10 varies based on the particular process and technology being used and the surface topology of the substrate 12. At least one trench 14 (two such trenches 14 are depicted in FIGS. 1 to 4) is then formed by patterning the area to be etched using standard semiconductor photolithographic techniques and then etching (for example, chemically) to form the trench 14. In particular, the trench 14 is etched to a depth equal to that of the insulating layer 10. In other words, the trench 14 is etched to reveal the surface of the substrate 12.

Illustratively, trench 14 is formed by: 1) applying a layer of resist material on the insulating layer 10; 2) exposing the resist material to an energy source which passes through a pattern mask; 3) removing areas of resist to form the pattern in the resist; 4) etching the trench 14; and 5) removing the remaining resist material. The energy source may be an e-beam, light source, or other suitable energy source.

Figure 1:
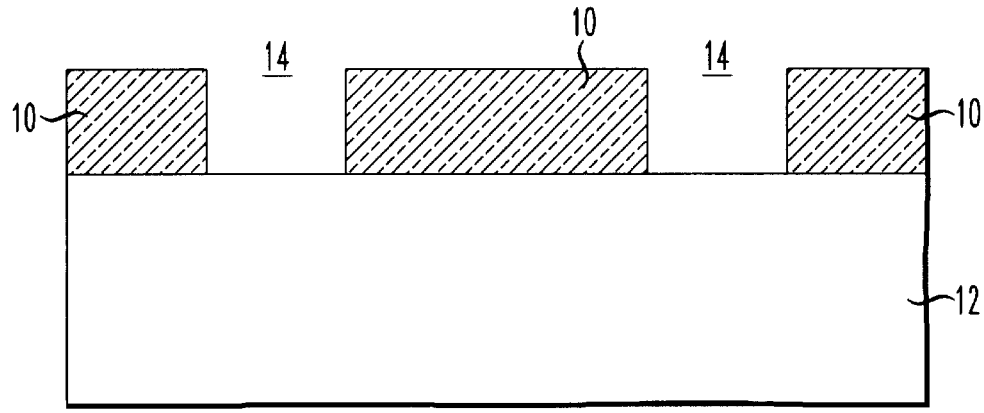
FIGS. 1 to 4 illustrate an integrated circuit during successive stages of manufacture according to a first illustrative embodiment of the present invention.
Figure 2:
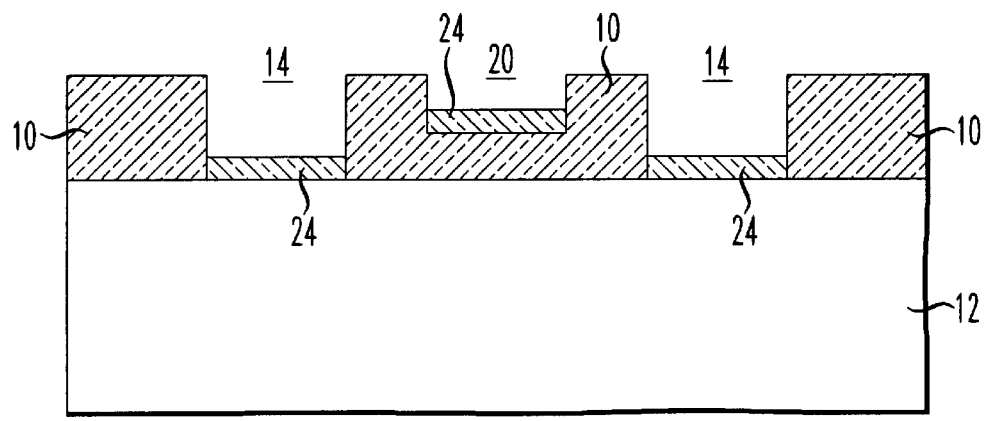

After formation of the first trench 14, a second trench 20, shown in FIG. 2, is formed in the insulating layer 10. The second trench 20 has a depth that is less than the depth of the first trench 14, and therefore has a base that sits above a remaining thickness of the insulating layer 10. The second trench 20 may be formed using the process described above to form the first trench 14. The depth of second trench 20 or the thickness of the insulating layer 10 remaining underneath the second trench 20 is dependent upon the desired characteristics of the structure being fabricated.

Using standard processing techniques, a relatively thin second insulating layer 24, shown in FIG. 2, is then formed at the base of the first trench 14 and at the base of the second trench 20. The second insulating layer 24 may be $SiO_2$ and may be formed in each trench at substantially the same time. The insulating layer 24 formed at the base of the first trench 14 may sit directly on top of the substrate 12.

Figure 3:
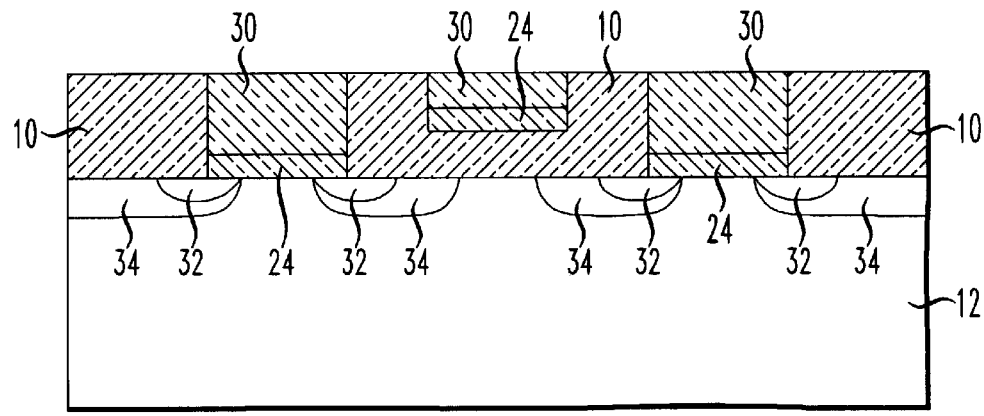

As depicted in FIG. 3, an implantation barrier 30 is then deposited to fill the trenches 14 and 20. The implantation barrier 30 comprises any material, which will not allow implanted ions to penetrate into the second insulating layer 24. Typical materials used for the implantation barrier 30 include: silicon nitride, tantalum nitride, titanium nitride, tungsten nitride, and zirconium nitride. After being deposited in a blanket fashion, the implantation barrier material is processed to make the surface of the implantation barrier 30 co-planar or substantially co-planar with the surface of the first insulating layer 10. For example, this is accomplished by a conventional chemical-mechanical polishing (CMP) technique or other planarization techniques.

Ion implantation is then performed to create a lightly doped diffusion (LDD) region as represented by region 32 in FIG. 3. Following creation of the LDD region 32, the structure is annealed. Transistor source and drain implants are then performed and the structure is again annealed following these further implants. Alternatively, the annealing may occur after all the implants are complete. Source and drain regions 34 are shown in FIG. 3. The choices of ions and their associated implantation energies are determined by the desired electrical characteristics of the resulting device. It should be noted that the ion implantation is performed in accordance with standard processing techniques (for example, through a mask of photo-resistive material that has been patterned to reveal the desired implant regions.)

The implantation barrier 30 of FIG. 3 is then removed by performing an etch (for example, chemical) which selectively attacks the implantation barrier 30 but leaves the insulating layer 10. The trench oxide 24 is also removed. For example, when the implantation barrier 30 is composed of silicon nitride, the implantation barrier 30 can be etched with phosphoric acid. Removal of the implantation barrier 30 and the oxide 24 reopens both the first trench 14 and the second trench 20.

Figure 4:
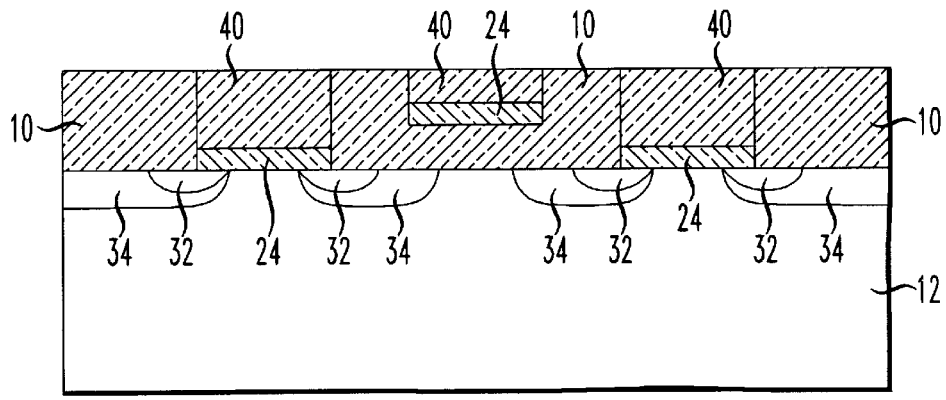

Next, oxidation may be performed to for an oxide layer 124, shown in FIG. 4, using conventional techniques. The oxide layer 124 is, for example, $SiO_2$. The oxide layer 124 in the trench 14 may constitute the gate oxide layer of a metal-oxide-semiconductor (MOS) transistor. The thickness of the oxide layer 124 is determined by the desired characteristics of the structure. The purpose of the oxide layer 124 in the second trench 20 varies based on the application as described below. In an alternative embodiment, the insulating layer 24 may not be removed and used as a gate oxide.

Subsequently, a polysilicon layer 40, shown in FIG. 4, is formed. More specifically, after a blanket deposition of polysilicon, the surface of the polysilicon layer is processed (for example, by CMP) to make the surface of the polysilicon layer 40 coplanar or substantially co-planar with the surface of the first insulating layer 10. This creates the dual-polysilicon structure depicted in FIG. 4.

The particular illustrative structure in FIG. 4 includes two MOS transistors respectively aligned with the trenches 14. Further, the polysilicon layer 40 formed in the shallow trench 20 may be used to create: 1) a capacitor, when used in conjunction with the oxides 124 and 10 and the substrate 12, 2) a resistor, or 3) a transistor with a gate oxide, comprised of insulating layers 124 and 10, that is thicker than that of the device formed in trench 14. In addition, these structures may be used to form analog devices. In an actual device, electrical connections (not shown) are made in conventional ways to the polysilicon 40 and to the source and drain regions 34.

Figure 5:
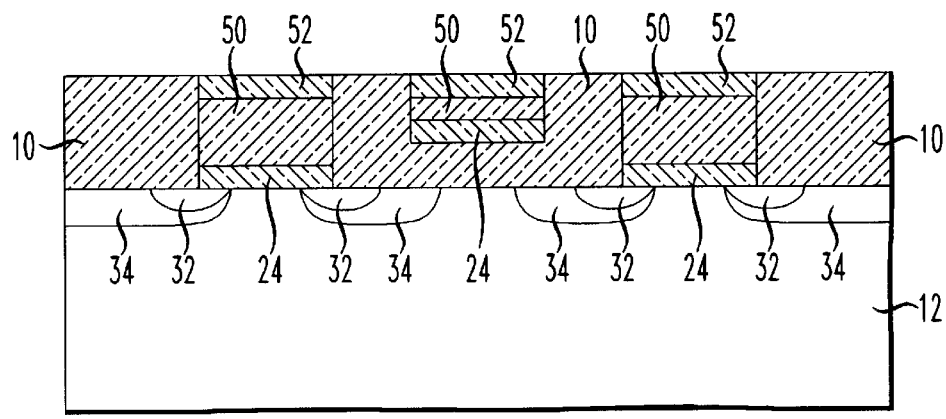
FIG. 5 is a cross-section of a dual-polysilicon structure after deposition and etching of polysilicon, and after deposition and planarization of an implantation barrier, according to a second illustrative embodiment of the present invention.
Figure 6:
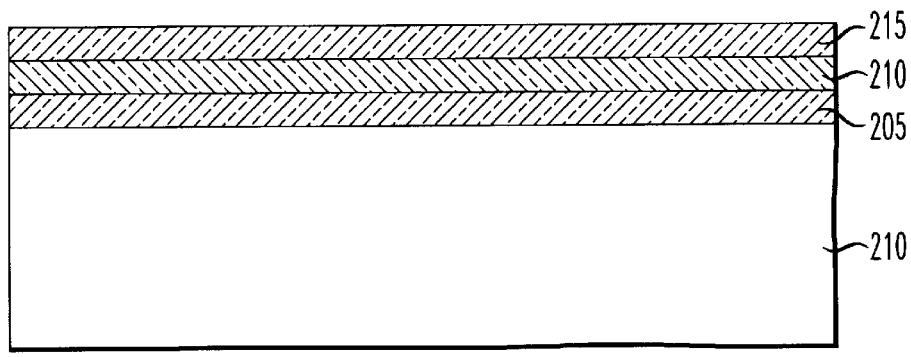
FIGS. 6 to 10 illustrate an integrated circuit during successive stages of manufacture according to a third illustrative embodiment of the present invention.

FIG. 5 illustrates a second embodiment of the present invention. The initial steps for forming the second embodiment are the same as the steps shown in FIGS. 1 and 2 of the first embodiment. After the trenches 14 and 20 are formed, an insulating layer 24 is formed at the base of the first trench 14 and at the base of the second trench 20. The insulating layer 24 is, for example, $SiO_2$. The insulating layer 24 that is formed at the base of the first trench 14 sits directly on top of the surface of the substrate 12. The insulating layer 24 in the trench 14 may constitute the gate oxide layer in a conventional MOS transistor. The thickness of the insulating layer 24 is determined by the desired characteristics of the structure. The insulating layer 24 at the base of the trench 20 functions in the same manner as described in the previous embodiment and may be $SiO_2$.

Next, as is shown in FIG. 5, a polysilicon layer 50 is then deposited in a blanket fashion. The surface of the deposited polysilicon layer is then processed (for example, using CMP) to make the surface of the polysilicon layer 50 co-planar or substantially co-planar with the surface of the first insulating layer 10. After planarization, a standard anisotropic polysilicon etch is performed to bring the level of the polysilicon in the first trench 14 and in the second trench 20 below the level of the surface of the first insulating layer 10. The distance from the surface should be sufficiently deep such that an implantation barrier 52, occupying the space overlying the polysilicon, is thick enough to block implanted ions from penetrating the polysilicon.

More specifically, an implantation barrier 52 is then deposited in a blanket fashion. The implantation barrier 52 is processed (for example, using CMP) to make the surface of the implantation barrier 52 co-planar or substantially co-planar with the surface of the first insulating layer 10. In this manner, a self aligned structure for ion implantation is formed. The purpose of the implantation barrier 52 is the same as in the prior illustrative embodiment. The implantation barrier may consist of any material sufficient to perform the aforementioned function. Some illustrative barrier materials were listed above.

In the second embodiment, ion implantation is performed to create a lightly doped diffusion (LDD) region as indicated by regions 32 in FIG. 5. Following creation of the LDD region, the structure is annealed. Transistor source and drain regions are then formed by further implants and the structure is again annealed following these additional implants. Alternatively, the annealing may occur after all implants have been performed. The source and drain regions are indicated as regions 34 in FIG. 5. Once again, the choices of particular ions and their associated implantation energies are dependent upon the desired electrical characteristics of the device being fabricated. It should be noted that the ion implantation is performed in accordance with standard processing techniques (for example, through a mask of photo-resistive material that has been patterned to reveal the desired implant regions.)

The implantation barrier 52 (FIG. 5) may be subsequently removed with a selective etch (for example, chemical) to reveal the polysilicon 50 below the implantation barrier 52. Subsequently, electrical connections (not shown) are made in conventional ways to the polysilicon 40 and to the source and drain regions 34.

A third illustrative embodiment is described below with reference to FIGS. 6 to 10 where an insulating layer 205 is formed on a substrate 200. Insulating layer 205 may be $SiO_2$ and have a substantially uniform depth. The substrate 200 may be silicon, gallium arsenide, germanium, or other material suitable for use as a substrate and as are known to those skilled in the art. There may be one or more layers formed between the substrate 200 and the insulating layer 205. The thickness of the insulating layer 205 varies based on the particular process and technology being used and the surface topology of the substrate 200.

Figure 7:
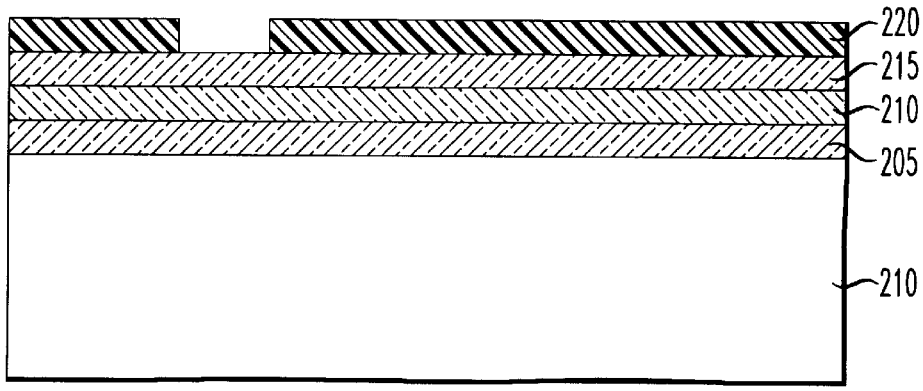
Figure 8:
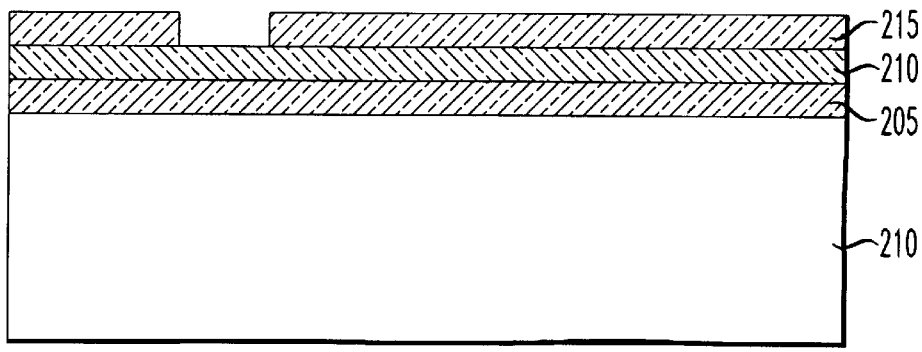

Subsequently, a stop layer 210 is formed on the insulating layer 205. The stop layer is, for example, TiN. The stop layer 205 is an etch stop layer as is described below. A second insulating layer 215 is formed on the stop layer 205. The second insulating layer is, for example, $SiO_2$. Next, a resist 220, shown in FIG. 7, is formed on the second insulating layer 215 and patterned as is described above and as is well known in the art. The second insulating layer 215 is etched to form trench 120, shown in FIG. 8. The etch process is a selective etch process that etches the insulating layer 215 at a higher or substantially higher rate than the stop layer 210. In other words, the stop layer 210 is resistant to the etch process used to etch insulating layer 215. By using this process, the depth of trench 120 formed during the etch process may be precisely controlled.

Figure 9:
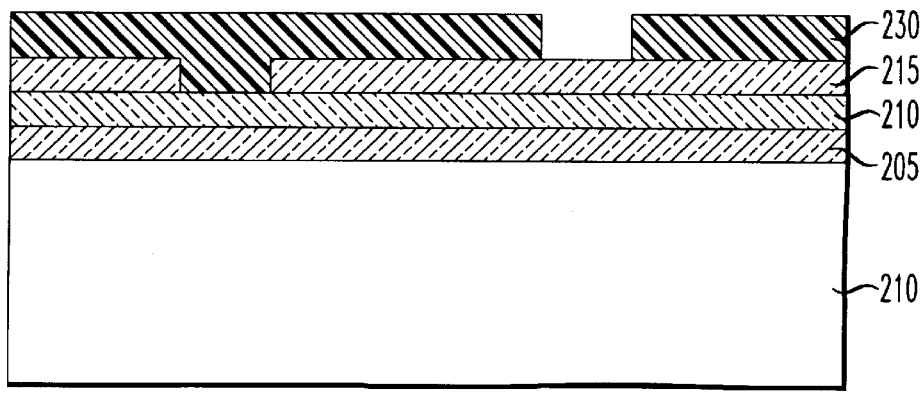
Figure 10:
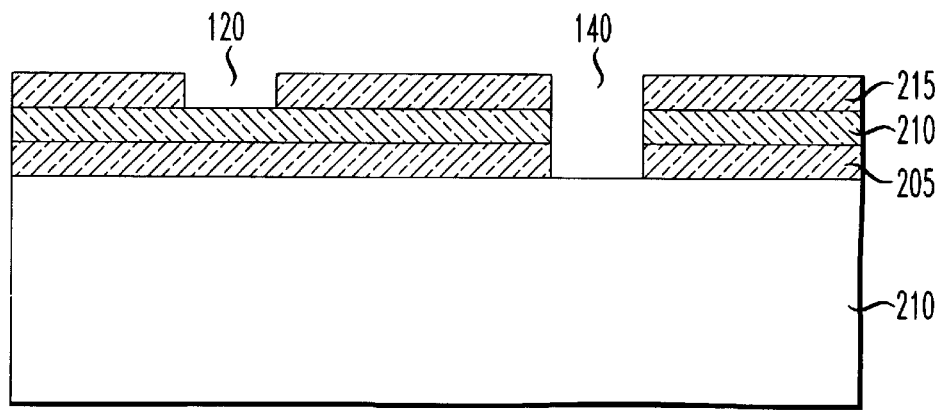

Next, as is shown in FIG. 9, a second resist layer 230 is formed on the second insulating layer 215. The second resist layer 230 is patterned as is described above and as is well known. The second insulating layer 215, the stop layer 210, and the first insulating layer 205 are etched using a process that selectively etches the materials of each layer to form trench 140. In other words, stop layer 210 is not resistant to the etching process used to form trench 140. After etching, the remaining portions of the second resist layer 230 are removed. The trench 140 is similar to the trench 14 shown in FIGS. 1–5 and trench 120 is similar to the trench 20 shown in FIGS. 1–5. Once trenches 140 and 120 have been formed, layers similar to layers 124, 40, 50, and/or 52 may be formed as described above in the first and second embodiments to form polysilicon devices.

Figure 11:
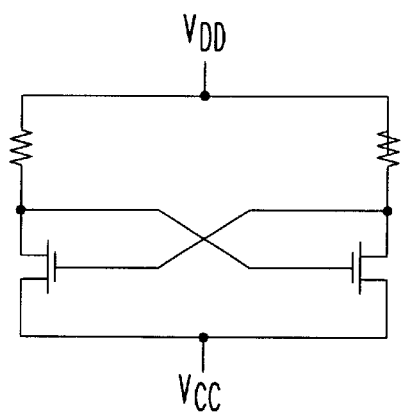
FIGS. 11–13 illustrate exemplary circuits using the first through third embodiments.
Figure 12:
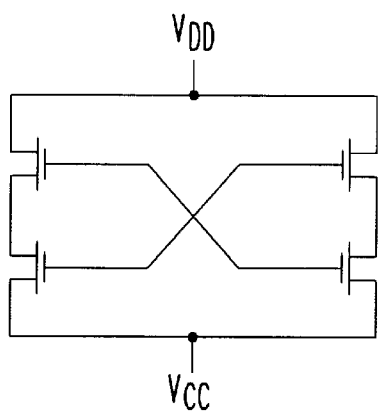
Figure 13:
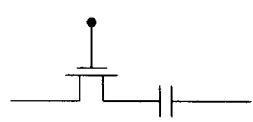

FIGS. 11–13 are illustrative devices that may formed using the first, second, and third embodiments. The device shown in FIG. 11 is an SRAM cell. In the embodiment shown in FIG. 11, resistors 300 may be formed using structures formed with the shallow trenches 120 or 20 and the transistors 310 may be formed using structures formed in trenches 14 or 140. Subsequent metal layers may be formed to interconnect resistors 300 and transistors 305 as is well known.

The device shown in FIG. 12 is alternative SRAM cell. In the embodiment shown in FIG. 12, transistors 400 may be formed using structures formed in the shallow trenches 120 or 20 and the transistors 410 may be formed using structures formed in trenches 14 or 140. Subsequent metal layers may be formed to interconnect transistors 400 and transistors 405 as is well known.

The device shown in FIG. 13 is a DRAM cell. In the embodiment shown in FIG. 13, the resistor 500 may be formed using structures formed in the shallow trench 120 or 12 and the transistor 510 may be formed using structures formed in trenches 14 and 140. Subsequent metal layers may be formed to interconnect resistor 500 and transistor 505 as is well known.

Finally, it is to be understood that although the invention is disclosed herein in the context of particular illustrative embodiments, those skilled in the art will be able to devise numerous alternative arrangements. Such alternative arrangements, although not explicitly shown or described herein, embody the principles of the present invention and are thus within its spirit and scope.

We claim:

1. A method for fabricating an integrated circuit comprising:

forming a first insulating layer;

forming at least a first trench and a second trench of differing depths in the first insulating layer; and forming a polysilicon material in the first and second trenches.

2. The method according to claim 1 wherein the first trench is deeper than the second trench and the method further comprises forming the first trench prior to forming the second trench.

3. The method of claim 1 further comprising forming a second insulating layer in the first and second trench.

4. The process according to claim 3 further comprising forming an implantation barrier in at least the first and second trenches to prevent penetration of implanted ions into portions of the second insulating layer.

5. The process according to claim 4 wherein the implantation barrier is formed only in the first and second trenches.

6. The process according to claim 1 further comprising implanting ions into the first insulating layer.

7. The process according to claim 6 further comprising removing the implantation barrier.

8. The process according to claim 6 further comprising:

removing the implantation barrier; and subsequently forming the polysilicon material in the first and second trenches.

9. The process according to claim 4 further comprising implanting ions into the first insulating layer.

10. The process according to claim 1 further comprising:

forming a second insulating material in the first trench to form a first structure; and forming the second insulating material in the second trench to form a second structure.

11. The process according to claim 10 wherein there are at least two first structures and at least two second structures and the method further comprises interconnecting the at least two first structures and the at least two second structure to form an SRAM cell.

12. The process according to claim 10 further comprising interconnecting the first structure and the second structure to form a DRAM cell.

* * * * *